(12) United States Patent
Dobrovolski

(10) Patent No.: US 6,329,212 B1
(45) Date of Patent: Dec. 11, 2001

(54) PROCESS FOR EXPOSING FOR ANALYSIS THE BACK SIDE OF A SEMICONDUCTOR DIE MOUNTED IN A PACKAGE

(75) Inventor: Michael Dobrovolski, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/227,599

(22) Filed: Jan. 8, 1999

(51) Int. Cl.⁷ .................................................. G01R 31/26
(52) U.S. Cl. ............................. 438/15; 438/4; 438/14
(58) Field of Search .............................. 438/14, 15, 4; 257/666, 668, 670, 673

(56) References Cited

U.S. PATENT DOCUMENTS

| | | | |
|---|---|---|---|
| 5,424,254 | * 6/1995 | Damiot | 438/15 |
| 5,698,474 | * 12/1997 | Hurley | 438/15 |
| 5,700,697 | * 12/1997 | Dlugokecki | 438/15 |
| 5,930,588 | * 7/1999 | Paniccia | 438/15 |
| 5,963,781 | * 10/1999 | Winer | 438/14 |
| 5,972,725 | * 10/1999 | Wollesen et al. | 438/14 |

* cited by examiner

Primary Examiner—Olik Chaudhuri
Assistant Examiner—Nathan W. Ha

(57) ABSTRACT

A method for preparing for analysis the back side of a die in a package. The method comprises removing a selected portion of the package, whereby a selected area of the die is exposed and a cavity is formed in the package. Thereafter, a selected portion the die at the exposed area is removed. In a final phase, the exposed surface of the die is polished.

19 Claims, 2 Drawing Sheets

PROCESS FOR EXPOSING FOR ANALYSIS THE BACK SIDE OF A SEMICONDUCTOR DIE MOUNTED IN A PACKAGE

FIELD OF THE INVENTION

The invention relates to analysis of semiconductor die, and more particularly to providing access to the back side of a packaged semiconductor die.

BACKGROUND

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then the electrical connections from the die to the package were made by wire bonding. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks, and be at a safe distance from neighboring lead wires. Wire loops in these packages are 8 to 12 mils, while those of ultra-thin packages are 4 to 5 mils. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistance levels associated with each bond. The wires are also relatively long and thus could contribute significantly to lead inductance and capacitance. This could limit acceptable signal speed in the system.

To increase the number of pad sites available for a die and to address the problems stated above and other problems, a different chip packaging technique called controlled collapse chip connection or flip chip packaging is being adopted. In this technology, the bonding pads are provided with metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads and soldered. As a result, the dies are commonly called flip chips in the industry. Each bump connects to a corresponding package inner lead. The packages which result are lower profile and have lower electrical resistance and a shortened electrical path. The output terminals of the package may be ball-shaped conductive bump contacts (usually solder, or other similar conductive material) are typically disposed in a rectangular array. These packages are occasionally referred to as "Ball Grid Array" (BGA). Alternatively, the output terminals of the package may be pins and such a package is commonly known as pin grid array (PGA) package.

In one type of package for a flip-chip, a ceramic package has a cavity in which the flip-chip is mounted. The backside of the die is mounted to a die paddle, and the die paddle is mounted in the cavity. Metal leads from the ceramic package can then be attached to the flip-chip. From a die analysis standpoint, a problem created by this type of package is that both the circuit side and back side of the die are covered. Thus, the structure prevents quality assurance and failure analysis of the packaged die. Therefore, it would be desirable to have a process to expose the back side of the die.

SUMMARY OF THE INVENTION

In an example embodiment, a method is provided for preparing a die in a package for analysis. The method comprises removing a selected portion of the package, whereby a selected area of the die is exposed and a cavity is formed in the package. Thereafter, a selected portion the die at the exposed area is removed. In a final phase, the exposed surface of the die is polished.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The following detailed description of the various example embodiments can best be understood when read in conjunction with the following drawings, in which.

Figure 1:
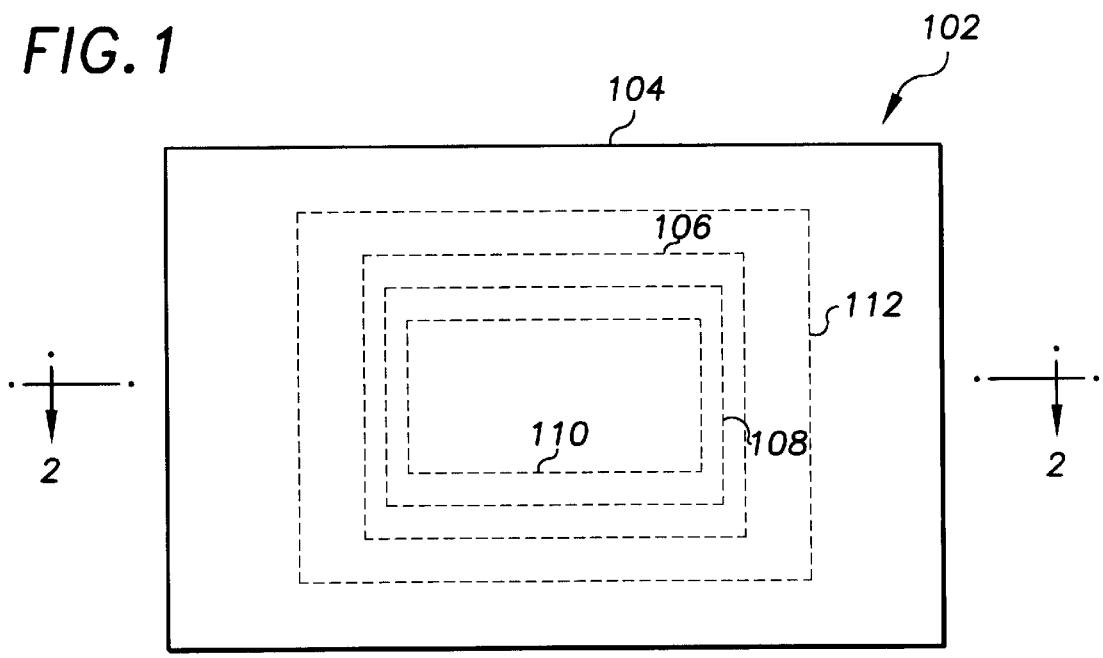
FIG. 1 shows a top view of a semiconductor package to be prepared for analysis.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

In the following detailed description of various example embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

FIG. 1 shows a top view of a semiconductor package 102 to be prepared for analysis. The package 102 includes a ceramic portion 104 in which a cavity is formed to carry a die. The cavity is formed in the underside of the ceramic portion 104 and is represented by dashed block 106. In the cavity 106, a die paddle 108 is mounted to the ceramic portion 104, and the die 110 is mounted to the die paddle 108. A lid 112 is mounted over the cavity 106 after the die 110 and die paddle 108 are mounted to the ceramic portion 104.

Figure 2:
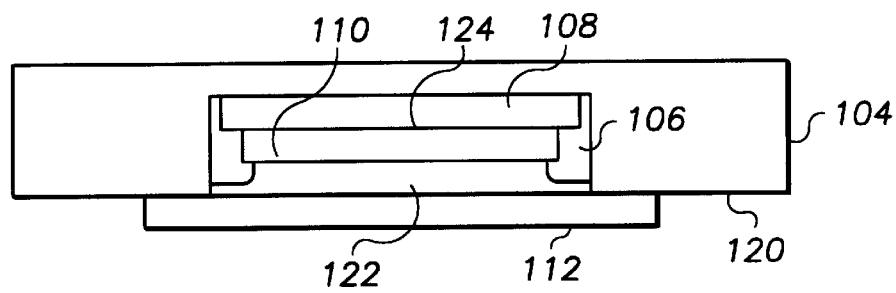
FIG. 2 is a cross-sectional view of the package of FIG. 1.

FIG. 2 is a cross-sectional view of the package 102 of FIG. 1. It will be appreciated that the lid 112 is mounted to the bottom surface 120 of the ceramic portion 104. The structure of FIG. 2 illustrates the problem presented when analysis, for example, photo-emission analysis, is desired to be performed on the die 110. Specifically, the ceramic portion 104 and the die paddle 108 absorb photo-emissions thereby preventing the analysis. Furthermore, removal of the lid 112 only provides access to the substrate-side 122 of the die 110. The substrate portion of the die also absorbs photo-emissions, thereby preventing analysis after the lid 112 is removed. Therefore, it would be desirable to expose the back side surface 124 of the die 110 in order to detect and analyze photo-emissions from the die.

Figure 3:
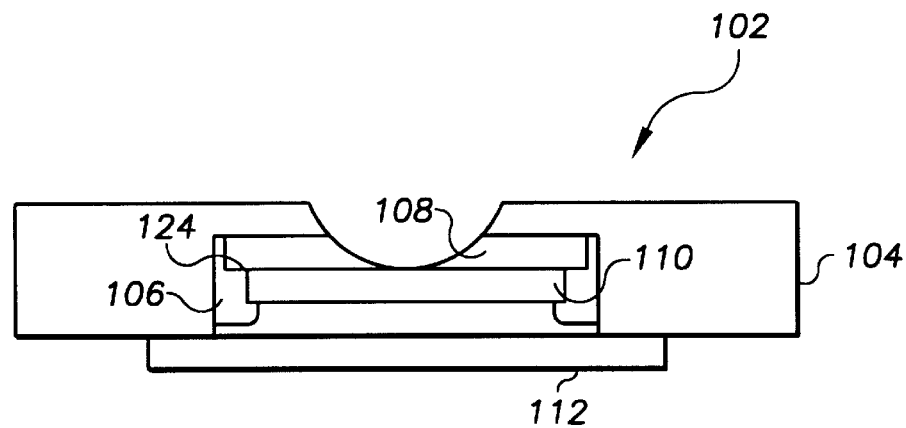
FIG. 3 is a cross-section view of the package after having had a portion of the ceramic structure removed.

FIG. 3 is a cross-section view of the package 102 after having had a portion of the ceramic structure removed. In an example embodiment, a dimpler system that is commercially available from the VCR Group of California is used to remove the selected portion of the ceramic 104. The dimpler system includes a grinding wheel arrangement in which wheels of varying diamond-based grits can be mounted and used. In an example method, wheels having a ¼ diameter can be used. A course grit wheel is used to grind the ceramic 104 and the die paddle 108 in the example embodiment. By way of periodically stopping the grinding and visually examining the package 102, a first phase of the process of removing the ceramic 104 and die paddle 108 is complete when the back side surface 124 of the die 110 is exposed.

After completing the first phase of material removal, the grinding wheel is changed to a fine grit in an example embodiment. The fine grit wheel is used to remove a selected portion of material from the back side of the die 110, wherein the fine grit provides more control over the rate at which the material is removed and produces a smoother surface of the exposed portion of the die. The depth of the grind into the die is determined based on the type of analysis to be performed. For example, the back side of the die is ground until photon emissions can be detected when the die is tested. This can be determined by repeatedly stopping the grinding and checking whether photons can be detected.

Figure 4:
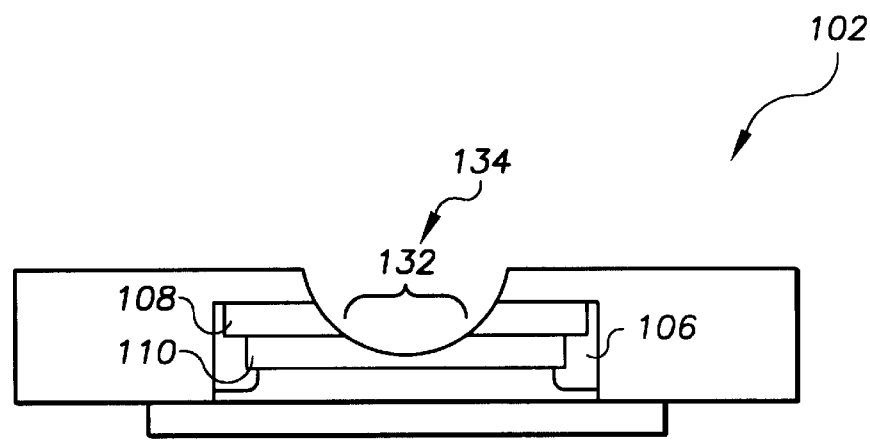
FIG. 4 is a cross-sectional view of the semiconductor package after having ground away a selected portion of the die.

FIG. 4 is a cross-sectional view of the semiconductor package 102 after having ground away a selected portion of the die 110. As stated above, the exposed surface 132 of the die 110 is partially smoothed by virtue of the fine grit grinding wheel. However, for photo-emission analysis, the surface must be further smoothed.

In the final phase of preparing the package 102 for analysis of the die 110, the surface 132 is polished. First, a paste is provided in the cavity 134. The paste is comprised of a mixture of de-ionized water and colloidal silica powders of varying abrasive properties, for example. Then a polishing wheel is attached to the dimpler, and the surface 132 is polished. Through visual inspection of the smoothed surface 132, the polishing process is complete when a desired luster is achieved on the exposed surface of the die. The die 110 can then be subjected to photo-emission analysis. For example, an analysis method can be used such as the one described in the co-pending patent application entitled, "SINGLE POINT HIGH RESOLUTION TIME RESOLVED PHOTOEMISSION MICROSCOPY SYSTEM AND METHOD," by Bruce et al., which was filed on Dec. 4, 1998 and having a Ser. No. 09/205,589, the contents of which is incorporated herein by reference.

The present invention has been described with reference to particular embodiments. These embodiments are only examples of the invention's application and should not be taken as a limitation. It will be appreciated that the invention may work with current induced from other sources and is not limited to the field of semiconductors. This invention could be used in other industries and with other materials. Various adaptations and combinations of features of the embodiments disclosed are within the scope of the present invention as defined by the following claims.

What is claimed is:

1. A method for preparing the back side of a die in a package for analysis, comprising:
   removing a selected portion of the package, whereby a selected area of the die is exposed and a cavity is formed in the package;
   repeatedly performing the steps of removing a selected portion of the die at the exposed area and stopping the removing for examination of the exposed area, the steps of removing and stopping for examination ceasing in response to reaching a predetermined level; and
   after reaching a predetermined level, polishing the die after having ground away the selected portion.

2. The method of claim 1, wherein removing the portion of the package comprises grinding away the selected portion of the package.

3. The method of claim 2, wherein removing a portion of the die comprises grinding away the selected portion of the die.

4. The method of claim 3, further comprising polishing a surface of the die exposed by the grinding.

5. The method of claim 4, further comprising introducing a polishing paste in the cavity before polishing.

6. The method of claim 1, wherein removing a portion of the die comprises grinding away the selected portion of the die.

7. The method of claim 1, wherein a grinding wheel having a first grit is used in the first grinding step.

8. The method of claim 7, wherein a grinding wheel having a second grit is used in the second grinding step.

9. The method of claim 8, wherein the first grit is a coarse grit.

10. The method of claim 9, wherein the second grit is a fine grit.

11. The method of claim 1, further comprising polishing a surface of the die exposed by removing the selected portion of the die.

12. The method of claim 11, further comprising introducing a polishing paste in the cavity before polishing.

13. The method of claim 1, wherein the package includes a ceramic structure and a die paddle, wherein the die paddle connects the die to the ceramic structure, and further comprising removing a selected portion of the die paddle prior to removing the portion of the die.

14. The method of claim 13, wherein removing the portion of the package comprises grinding away the selected portion of the ceramic structure and die paddle, and removing a portion of the die comprises grinding away the selected portion of the die.

15. The method of claim 14, wherein a grinding wheel having a coarse grit is used in grinding the ceramic structure and die paddle, and a wheel having a fine grit is used in grinding the die.

16. The method of claim 1, wherein the predetermined level is a function of a specific type of analysis to be performed on the die.

17. The method of claim 1, wherein after stopping for examination, the exposed area is monitored for photo emissions before repeating the step of removing a selected portion of the die.

18. The method of claim 17, wherein removing a selected portion of the die includes grinding the die in anticipation of reaching the predetermined level.

19. The method of claim 16, wherein after stopping for examination, the exposed area is monitored for photo emissions before repeating the step of removing a selected portion of the die, and wherein removing the selected portion of the die includes grinding.

* * * * *